United States Patent [19]

Kasperkovitz

[11] Patent Number: 4,903,331

[45] Date of Patent: Feb. 20, 1990

[54] QUADRATURE DETECTION RECEIVER WITH SEPARATE AMPLITUDE AND PHASE CONTROL

[75] Inventor: Wolfdietrich G. Kasperkovitz, Eindhoven, Netherlands

[73] Assignee: U.S. Philips Corporation, New York, N.Y.

[21] Appl. No.: 241,172

[22] Filed: Sep. 6, 1988

[30] Foreign Application Priority Data

Sep. 3, 1987 [EP] European Pat. Off. ........ 87201668.8

[51] Int. Cl.$^4$ ............................................. H04B 1/16
[52] U.S. Cl. ................................... 455/207; 209/265
[58] Field of Search .............. 455/207, 258, 265, 146, 455/208, 260, 264, 256, 209, 303–306, 295, 296; 329/50, 122

[56] References Cited

U.S. PATENT DOCUMENTS 3,961,262  6/1976  Grassmann .......................... 455/208
4,633,315  12/1986  Kasperkovitz ...................... 358/188

FOREIGN PATENT DOCUMENTS 2735945  4/1978  Fed. Rep. of Germany ...... 455/265

*Primary Examiner*—Robert L. Griffin
*Assistant Examiner*—Curds Kuntz
*Attorney, Agent, or Firm*—David R. Treacy

[57] ABSTRACT

A pair of signal paths 3-1 and 3-2 are connected in parallel to an input 2, each composed of the respective mixing stages 4-1, 4-2, low-pass filters 5-1, 5-2 and mixing stages 6-1, 6-2. The mixing stages 4-1, 4-2 are connected to the oscillator 8 in a phase-quadrature relationship. The mixing stages 6-1, 6-2 are connected to the oscillator 9 in a phase-quadrature relationship and are both connected to a superposition circuit 7 having an output 10. For obviating the drawback of unbalance in the signal processing in the signal paths 3-1, 3-2, the receiver 1 includes a control signal arrangement 11, which is constituted by the respective further mixing stages 14, 25, low-pass filters 47, 48, and mixing stages 17, 29 for producing at the control signal outputs 22, 34 an amplitude and a phase control signal for correcting this unbalance. The linking of the oscillator 9 to the mixing stages 14, 25 and through a divider 36 to the mixing stages 6-1, 6-2 makes the use of an additional narrow band phase-locked loop redundant so that the receiver 1 has short acquisition time, hence is very suitable for use in mobile systems and can easily be integrated on a chip.

8 Claims, 2 Drawing Sheets

QUADRATURE DETECTION RECEIVER WITH SEPARATE AMPLITUDE AND PHASE CONTROL

BACKGROUND OF THE INVENTION

The invention relates to a high-frequency receiver comprising a first oscillator, a second oscillator, and a pair of signal paths connected in parallel to an input. The signal paths each include, arranged in succession, the series arrangement of a first pair of mixing stages, receiving from the first oscillator signals in a phase-quadrature relationship for a down-conversion of the received high-frequency signals; and filtering means for selecting a received high-frequency signal and a second pair of mixing stages, receiving from the second oscillator signals in a phase-quadrature relationship having a frequency value $f_2$ for an up-conversion of the selected high-frequency signal. The receiver includes a superposition circuit connected to the second pair of mixing stages, and having a signal output for producing at the signal output an output signal containing two frequency components with the central frequency value $f_2$ being situated substantially centrally between them; and a control signal arrangement comprising a third pair of mixing stages having first mixing inputs, second mixing inputs and outputs, the two second mixing inputs being connected to the signal output for generating at the outputs control-signals for correcting undesired amplitude and phase differences in the signal processing in the signal paths.

Such a receiver is known from the European patent application Ser. No. 122 657, to which U.S. Pat. No. 4,633,315 corresponds. This patent discloses how a received modulated high-frequency signal is processed in the two signal paths. As the down-conversion of the frequency is generally accompanied by a folding around 0 Hz of the frequency components in the modulation signal, a modulation diagram has been realized according to which an up-conversion of the frequency is effected of the signals in the two signal paths by means of the second pair of mixing stages. This frequency conversion is followed by a superposition (addition or subtraction) in the superposition circuit, for unfolding the above frequency components. Unfolding is accomplished when undesired frequency components in the output signal of the superposition circuit cancel each other substantially completely during the superposition process. However, mutual differences in the signal processing in the two signal paths an lead to undesired amplitude and phase differences, causing undesired frequency components to develop in the superposed output signal, thereby producing to distortion and whistling in the modulation signal obtained after detection of the output signal. If there is no modulation of the received high-frequency signal, after superposition there will remain mainly two frequency components in the output signal. The first component is the desired carrier component to be detected. The second component is one of the error components resulting from this superposition and is basically undesired, but forms a reliable measure for the possibly available undesired mutual difference in the signal processing in the two signal paths. In the known receiver having a narrowband carrier-selection circuit, only the desired carrier component of the output signal is allowed to pass together with the output signal. The carrier-selection circuit is connected in series with an additional phase-locked loop for regenerating from the carrier component an in-phase detection carrier used for deriving the control signals.

The disadvantage of utilizing such a narrow-band series-arrangement of the carrier-selection circuit and the additional phase-locked loop is the fact that fast phase-locking to a carrier having a different frequency, for example, when switching-over to a new signal to be received, is generally hard to accomplish.

SUMMARY OF THE INVENTION

It is an object of the invention to realize a receiver which is easy to integrate and has a broad scope of uses in which there is a faster pulling-in of a new signal.

For this purpose a receiver in a first embodiment according to the invention is characterized in that the control signal arrangement includes a pair of further mixing stages having first mixing inputs, second mixing inputs and mixing outputs. The second mixing inputs of the pair of further mixing stages are coupled to the signal output; the mixing outputs are coupled to the first mixing inputs of the third pair of mixing stages; and phase-quadrature oscillator signals having a frequency value $2 \times f_2$ generated by the second oscillator are applied to the first mixing inputs of the pair of further mixing stages, for generating at each of the mixing outputs a frequency-mirror signal containing two frequency components, which are mirror-image components of the two frequency components in the output signal at the signal output about the central frequency value $f_2$. The receiver includes a divide-by-two divider inserted between the second oscillator and the second pair of mixing stages to produce the frequency $f_2$.

The invention is based on the material recognition that by using one and the same oscillator, from which an oscillator signal is applied to the second pair of mixing stages in the signal paths as well as the pair of further mixing stages, the identical frequency components in the output signal are situated at a like frequency value and the mirror-symmetrical frequency signals show a fixed phase-difference relative to each other at the two mixing outputs, making the use of an additional phase-locked loop totally redundant.

It is advantageous that the receiver according to the invention can be integrated more easily, as it is composed of modules which generally can be integrated in a simpler manner than a phase-locked loop.

It should be observed that by coupling the oscillator signal to the first mixing input of the first further mixing stage, the generated DC current component of the first control signal forms a representative measure for the undesired amplitude differences occurring between the signals in the two signal paths, and that by effecting a coupling of the quadrature oscillator signal to the first mixing input of the second further mixing stage, the generated DC current component in the second control signal forms a representative measure for the undesired phase differences occurring between the quadrature signals in the two signal paths.

A further advantage is the fact that the proposed solution does not entail any modules causing a considerable time delay for pull-in; therefore pulling-in takes place quickly so that there is a short acquisition time. This fast pull-in creates new possibilities for using the receiver in fields where short acquisition time is of the utmost importance, for tracing a received signal possibility disturbed by interference. It is worth considering its use in calling systems and, more specifically, in mobile systems for radio and telephony.

A second embodiment of the receiver according to the invention is characterized in that the receiver includes a bandpass filter having an output connected between the signal output and the second mixing inputs, having a pass-band which is sufficiently wide to allow to pass on this signal-output the two frequency components of the output signal.

This embodiment has the advantage that the bandpass filter is permitted to have a wide passband accommodating the carrier component with the modulation signal as well as the error component of the output signal.

A third embodiment of the receiver according to the invention is characterized in that the receiver includes a limiter having an output, which is connected between the output of the bandpass filter and the second mixing inputs.

When using the limiter it will be advantageous to connect thereto a detector for further processing, more specifically, the carrier component with the modulating signal, as a result of which the carrier signal has a constant level so that AM modulation is suppressed.

A fourth embodiment of the receiver according to the invention is characterized in that the receiver includes a low-pass filter, connected between the output of the limiter and the second mixing inputs.

This fourth embodiment is advantageous in that any frequency components developed during the amplitude-limiting process but having a disturbing effect on the generation of the control signal, can in a simple manner be eliminated by filtering when using this low-pass filter.

A fifth embodiment of the receiver according to the invention is characterized in that the control signal arrangement includes low-pass filters connected between the mixing outputs and the first mixing inputs of the third pair of mixing stages. These low-pass filters have a passband which is sufficiently wide to allow to pass the two frequency components of the respective mirror-symmetrical frequency signals.

Inserting these low-pass filters is advantageous in that undesired frequency components, such as mixing products occurring in the further mixing stages during the mixing process, are suppressed. Compared to a selection of the passband of these low-pass filters, in which for example one of the two frequency components is allowed to pass in the mirror-symmetrical frequency signals, the DC current components in the first and the second control signal have an amplitude which is twice as large.

The invention and its advantages will be further explained with reference to the drawing.

DESCRIPTION OF THE PREFERRED EMBODIMENT

Figure 1:
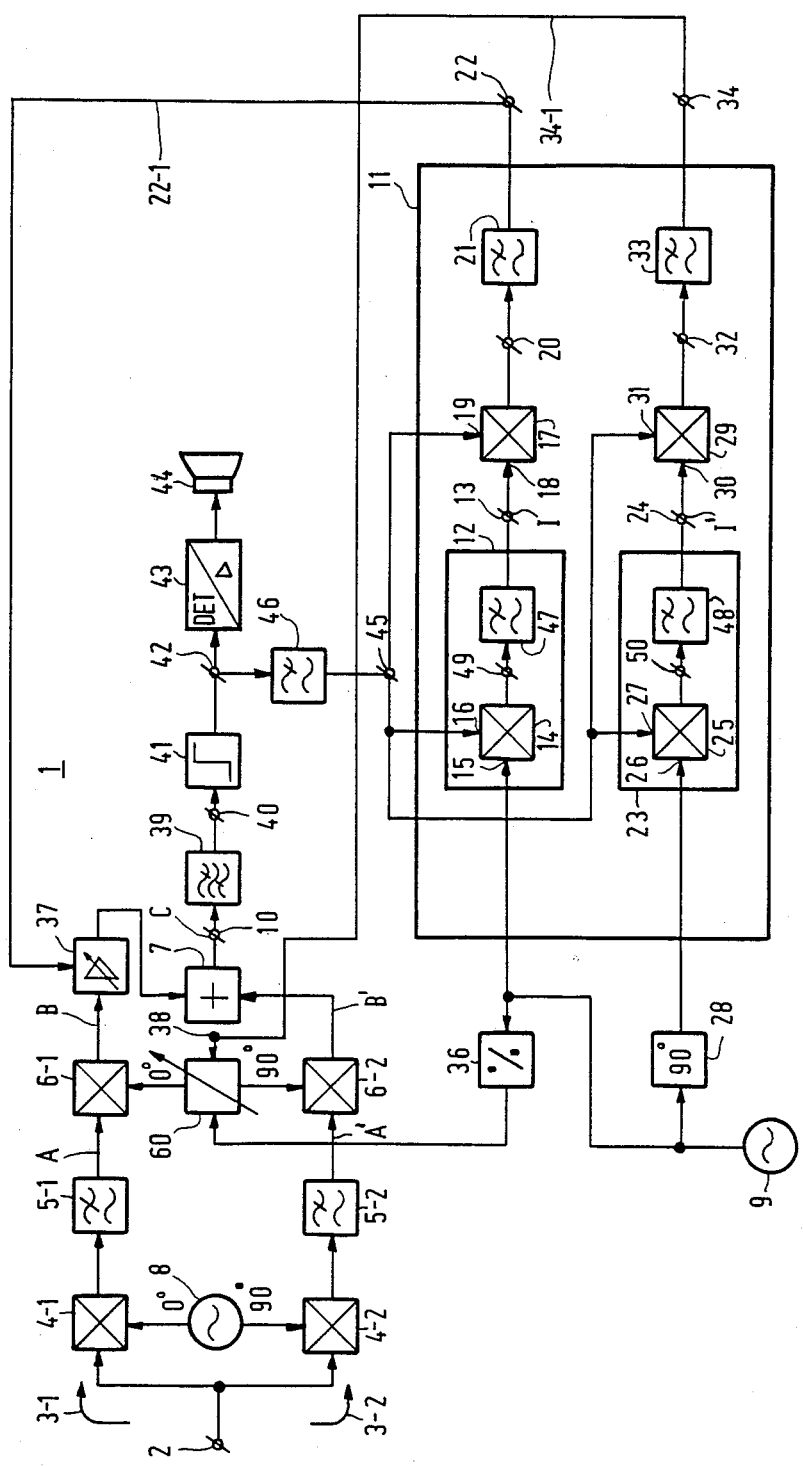
FIG. 1 is a block diagram of a preferred embodiment of the receiver according to the invention.

The receiver 1 shown in FIG. 1, including two quadrature signal paths 3-1 and 3-2 connected to an input 2, is used in integrated receivers for receiving, for example, frequency, amplitude or single-sideband modulated signals.

Each of the respective signal paths 3-1 and 3-2 includes a mixing stage 4-1 and 4-2, filter means indicated in FIG. 1 as a low-pass filter 5-1 and 5-2, and a mixing stage 6-1 and 6-2, which are separately interconnected in series in the respective signal paths 3-1 and 3-2. The signal paths 3-1 and 3-2 are both connected to a superposition circuit 7. The mixing stages 4-1 and 4-2 are connected to a generally tunable first oscillator 8, whose quadrature oscillator signals, represented by "O" and "90" are used for a down-conversion of the received high-frequency signals available at input 2. When tuning the oscillator frequency within the frequency band of a received modulated high-frequency signal, a frequency folding around 0 Hz takes place after mixing. The selection of a desired high-frequency signal from the received signals is carried out in the low-pass filters 5-1 and 5-2. The low-pass characteristics of these filters 5-1 and 5-2 both show cross-over frequencies having small values, generally realizing a steep descent of the edges of these filters. The steep edges provide a great selectivity and minimize the interference with the signal selected by the filters 5-1 and 5-2 owing to adjacent channels situated near the received high-frequency signal.

The receiver 1 includes a second oscillator 9 which applies the oscillator signal in quadrature to the two mixing stages 6-1 and 6-2 through among other things a phase splitter 60 in a manner to be disclosed hereinafter. After the low-pass filtering, an up-conversion of the signals in the parallel signal paths 3-1 and 3-2 is realized in the mixing stages 6-1 and 6-2 to a generally fixed frequency value of the oscillator 9. Generally, two folding sidebands will occur, whose values will lie on both sides of the fixed frequency value. The superposition circuit 7 has a signal output 10 at which an output signal is available produced by superposing the output signals of the mixing stages 6-1 and 6-2. The superposition circuit 7 can be designed as an adder or a subtractor depending on whether the band to be demodulated is a low-frequency band or a high-frequency band. If the frequency of the output signal of the oscillator 8 is indicated by $f_1$, that of oscillator 9 by $f_2$ and the carrier frequency of the received high-frequency signal by $f_c$, the desired frequency band to be received is situated around the frequency value $f_2-f_1+f_c$ with the first version of the superposition circuit 7, and around the frequency value $f_2+f_1-f_c$ with the second version thereof. In the first version the frequency band of a basically undesired error component, which will further be explained, falls at approximately $f_2+f_1-f_c$; and in the second version this falls at approximately $f_2-f_1+f_c$.

As the received high-frequency signal on input 2 is generally modulated, a frequency band around the desired and undesired frequency components of the signals has been discussed above. For simplicity it will be assumed hereinafter that the received high-frequency signal is unmodulated and only the carrier component is received. Then it is possible to deal with frequency components instead of frequency bands.

Figure 2A:
FIG. 2a to 2e show frequency spectrums of various signals occurring in the receiver according to FIG. 1.
Figure 2B:
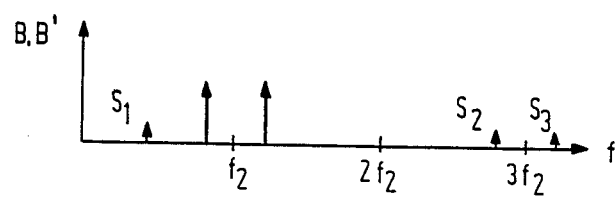
Figure 2C:
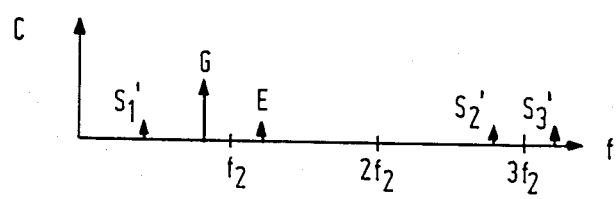

FIG. 2a shows the spectrums of the signals referenced A and A' as a function of the frequency; information with respect to the phase of the signals is not given in this figures and the following Figures. After mixing the signals A and A' with the oscillator signal having a frequency $f_2$ obtained indirectly from the oscillator 9, the spectrums of the output signals of the mixing stages 6-1 and 6-2 will be as shown in FIG. 2b. The output signal at the signal output 10 then has substantially two frequency components which are situated on both sides of the oscillator frequency $f_2$. FIG. 2c shows the two frequency components referenced G and E of the output signal C for the case in which the superposition circuit 7 is designed as an adder. The desired carrier component is referenced G. The above error component, referenced E, forms a reliable measure for any mutual differences in the signal processing in the parallel signal paths 3-1 and 3-2. These differences are the result of undesired amplitude and phase differences between the signals B and B' applied to the superposition circuit 7, as a result of which the error component E occurs together with the desired frequency component G in the output signal at signal output 10. The presence of this error component E leads to the fact that, when the received signal is modulated, annoying distortion and whistling will occur in the signal obtained after the output signal C has been demodulated.

The receiver 1 shown in FIG. 1 includes a control signal arrangement 11 for generating generally two control signals in a manner to be discussed hereinbelow. The first control signal forms a measure for the undesired amplitude differences occurring between the signals and the two signal paths 3-1 and 3-2; accordingly, the second control signal forms a measure for the occurring undesired phase differences. An embodiment of a circuit in wich the control signals are used for reducing these amplitude and phase differences is known from the U.S. Pat. No. 4,633,315 and European patent application No. 122 657 discussed in the introductory part.

A further possible embodiment of such a circuit is shown in FIG. 1, in which, for example, in the signal path 3-1 between the mixer stage 6-1 and the superposition circuit 7 an adjustable amplifier (reducer) 37 is connected to the first control signal output 22 still to be discussed, so as to reduce the unwanted amplitude differences by affecting the amplification of the first control signal. It will be evident that the adjustable amplifier can be positioned anywhere in the signal path 3-1 or 3-2. Further, in such a circuit the phase splitter 60, for example, contains a phase control having a phase control input 38. The phase control input 38 is connected to the second control signal output 34 which is to be discussed hereinafter, for affecting with the second control signal the phase quadrature relationship between the quadrature oscillator signals applied to the mixing stages 6-1 and 6-2. Instead of the phase controllable phase splitter 60 also a non-controllable phase splitter 60 can be used in combination with a phase shifter inserted at an arbitrary position in the signal path 3-1 or 3-2 connected to output 34.

The receiver discussed in the aforementioned patent and application includes among other things a series arrangement of a carrier selection circuit with an additional phase-locked loop connected to the superposition circuit designed as an adder. By means of the output signal of the carrier selection circuit the loop is excited. A disadvantage of that arrangement is that the acquisition time (that is the time the loop needs to lock on this output signal after being excited for the first time) is relatively large. This is caused by the fact that the bandwidth of the phase-locked loop is narrow.

As will be evident hereinafter no additional phase-locked loop whatsoever is used in the receiver 1 according to the invention. Therefore, the receiver 1 will not be subject to the above disadvantages resulting from the use of the additional loop.

In accordance with the invention the control signal arrangement 11 of the receiver 1 includes a circuit 12 (called hereinafter a first frequency mirroring circuit) having a first mirror-symmetrical signal output 13. The first frequency mirroring circuit 12 comprises a first further mixing stage 14. The first further mixing stage 14 has two mixing inputs 15 and 16 and a mixing output 49. The first mixing input 15 is connected to the oscillator 9 in a manner to be discussed hereinafter. The second mixing input 16 is connected to the signal output 10 of the superposition circuit 7 also in a manner to be discussed hereinafter.

Figure 2D:
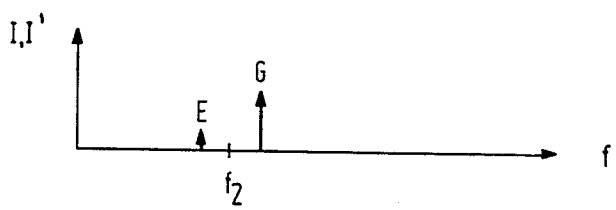

Mixing the output signal at the signal output 10 with an oscillator signal having a frequency value of twice $f_2$ of oscillator 9 causes the two frequency components G and E to become available at the first mirror-symmetrical signal output 13 as mirror image components about $f_2$. The so-called first frequency mirror-symmetrical signal available at the first mirror-symmetrical signal output 13 is referenced I. The two mirror-symmetrical frequency components G and E are shown in FIG. 2d.

The control signal arrangement 11 comprises a first mixing stage 17 of a third pair of mixing stages having two mixing inputs 18 and 19 and an output 20. The first mixing input 18 is connected to the first mirror-symmetrical signal output 13 whilst, and the second mixing input 19 is coupled to the signal output 10, as shown in FIG. 1 by being connected to the second mixing input 16, as shown in FIG. 1. The control signal arrangement 11 comprises a first low-pass filter 21 connected to the output 20, and having a first control signal output 22. As the respective components G and E in FIGS. 2c and 2d are situated mirror symmetrically, at a like frequency, after mixing in the first mixing stage 17 of the third pair a so-called first control signal with a DC current component will occur at output 20. The DC current component of the first control signal occurring at first control signal output 22 after passing through the low-pass filter 21 is referenced K in FIG. 2e. This first control signal in the form of a DC current component forms a reliable measure for the unwanted amplitude differences occurring between the signals in the two signal paths 3-1 and 3-2. Through the feedback circuit 22-1 of the controllable amplifier 37 this first control signal is supplied for correcting the amplitude of the signal occurring in the signal path 3-1.

The embodiment of receiver 1 shown in FIG. 1 also comprises a second frequency mirroring circuit 23 having a second mirror-symmetrical signal output 24. The second frequency mirroring circuit 23 comprises a second further mixing stage 25. The second further mixing stage 25 has two mixing inputs 26 and 27 and a mixing output 50. The first mixing input 26 is connected in a phase quadrature relationship to the oscillator 9 through a 90° phase-shifting network in a manner to be discussed hereinafter. The second mixing input 27 is connected to the signal output 10 of the superposition circuit 7 and is connected to the second mixing input 16.

Mixing the output signal at the signal output 10 with the phase quadrature oscillator signal having a frequency value $f_2$ of the oscillator 9 causes the two frequency components G and E to be available at the second mirror-symmetrical signal output 24 as a mirror-symmetrical value about $f_2$. The so-called second frequency mirroring circuit available at the second mirror-symmetrical output 24 is referenced I' and the frequency spectrum corresponds to the spectrum represented in FIG. 2d.

Figure 2E:
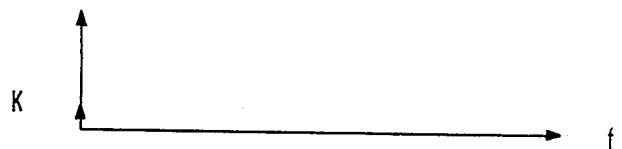

The control signal arrangement 11 further comprises a second mixing stage 29 of the third pair of mixing stages having two mixing inputs 30 and 31 and an output 32. The first mixing input 30 is connected to a second mirror-symmetrical signal output 24, and the second mixing input 31 is connected to the signal output 10 by being connected to the second mixing input 16. The control signal arrangement 11 comprises a second low-pass filter 33 connected to the output 32 and having a second control signal output 34. After mixing in the second mixing stage 29 the second control signal having a DC current component will arise at the output 32 in a manner already discussed for the first control signal. after low-pass filtering the DC current component, also referenced by the letter K in FIG. 2e, is available at the second control signal output 34. This second control signal in the form of a DC current component forms a reliable measure for the undesired phase differences occurring between the signals in the two signal paths 3-1 and 3-2 and is applied to the phase control input 38 of the controllable phase splitter 60 through the feedback circuit 34-1 in order to correct the mutual phase of the "0" and "90" phase quadrature oscillator signals.

The oscillator 9 is connected to the first mixing input 15 and through among other things the 90° phase shifter 28 having the first mixing input 26. Realizing a frequency mirror symmetry around the oscillator frequency $f_2$ situated substantially equidistant from the two frequency components G and E by means of the two frequency mirroring circuits 12 and 23 is achieved in a simple manner by giving the frequency of the signal at the first mixing input 15 (and owing to the phase-shifting network 28, at the first mixing input 26) a value of $2 \times f_2$. The linking of the respective mixing stage 6-1 in signal path 3-1 and the mixing stage 6-2 in signal path 3-2 with the oscillator 9 can then be realized by means of a divide-by-two divider 36, which can be implemented on a chip in a simple manner. The divide-by-two divider 36 is inserted between the oscillator 9 and the phase splitter 60.

Between the oscillator 9 and the mixing stages 6-1 and 6-2 low-pass filters can be inserted, if so desired, with a review to suppressing any disturbing higher harmonics in the oscillator signal.

An advantageous feature is the fact that the receiver 1 cancels phase and amplitude differences, caused by the mixing stages 4-1, 4-2 as well as the low-pass filters 5-1, 5-2 and mixing stages 6-1, 6-2.

The explanation given so far is based on the output signal at signal output 10 containing two frequency components. This is correct, essentially. However, when taking a closer look at the spectrum of the output signal at signal output 10, referenced C, as shown in FIG. 2c, it is shown that so-called false frequency components also occur in the signal. A plurality of these false frequency components are shown in the FIGS. 2b and 2c referenced $S_i$ and $S'_i$ (for i=1, 2 and 3). The component $S_1$, for example, is caused by the fact that a fraction of the input signal A and A' ends up in the output signal C at signal output 10 through the mixing stages 6-1 and 6-2 and the superposition circuit 7. The components $S_2$ and $S_3$ are the components with two frequency components G and E mixed around the third harmonic of $f_2$.

The receiver shown in FIG. 1 comprises a band-pass filter 39 for allowing to pass, for example, both components G and E. It is advantageous that the bandpass filter 39 is permitted to be such a wideband filter that the two components are allowed to pass. If so desired, it is also possible to allow to pass only the desired carrier component G, surrounded by the frequency band arisen during the modulation of the received high-frequency signal.

The bandpass filter 39 has an output 40 to which an amplitude limiter 41 having an output 42 can be connected. This provides a fixed value for the loop gain of the feedback circuit 22-1. It is advantageous that a detector of any well-known type and an amplifying circuit 43 with a loudspeaker 44 can be connected straight to output 42. More specifically, when using the receiver in mobile systems, in which the received signal is generally provided with amplitude modulations due to interference by multipath distortion, the signal at output 42 is free from these amplitude modulations which are generally considered annoying. If desired, the output 42 can be connected straight to the mixing inputs 16, 19, 27 and 31.

The receiver 1 shown in FIG. 1 includes a lowpass filter 46 having an output 45 connected to the output 42 and the mixing inputs 16, 19, 27 and 31. In this case the receiver 1 includes no more than one low-pass filter 46 used for disposing of spectral signal variations at output 45, which have developed, for example, during an amplitude-limiting process. Thus, the spectrum of the signal at output 45 contains only the two frequency components G and E.

The receiver 1 shown in FIG. 1 further includes a low-pass filter 47 connected between the mixing output 49 of the first further mixing stage 14 and the first mirror-symmetrical signal output 13, and a low-pass filter 48 connected between the mixing output 50 of the second further mixing stage 25 and the second mirror-symmetrical signal output 34. Using the low-pass filters 47 and 48 will cause the spectral variations in the signals on the mirror-symmetrical signal outputs 13 and 24 developed during the mixing process to be suppressed. Thus, the spectrum of the signals on the outputs 13 and 24 only contains two mirror-symmetrical frequency components E and G.

A further advantage of the receiver 1 explained hereinbefore is the fact that the configuration of each of the signal paths 3-1 and 3-2, the structure of the first further mixing stage 14 the low-pass filter 47 and the first mixing stage 17, as well as the configuration of the second further mixing stage 25, the low-pass filter 48 and the second mixing stage 29 is always the same; that is, the configuration of a low-pass filter inserted between two mixing stages. This equivalent configuration permits the receiver 1 to be implemented on a chip in a simple manner.

For the oscillators 8 and 9 square-wave oscillators are to be preferred, producing a square-wave oscillator signal having opposite amplitude values during equal periods of time. In practice, such a square-wave signal contains a substantially negligible DC current component as a result of which amplitude and/or phase variations due to DC offsets in the signal paths 3-1 and 3-2 are suppressed.

The embodiments of the invention in which can exclusive property or privilege is claimed are defined as follows:

1. A receiver for high frequency signals, comprising:
   a first oscillator providing high frequency oscillator signals in a phase quadrature relationship, and oscillator means providing signals of a frequency $f_2$ in a phase quadrature relationship, a pair of signal paths connected in parallel to an input, each signal path including a series arrangement including:
- a first mixing stage receiving a respective one of said high frequency oscillator signals for down-conversion of received high frequency signals,
- filtering means for selecting a down-converted signal from the respective mixing stage, and
- a second mixing stage receiving the respective selected high frequency signal and a respective one of said signals of a frequency $f_2$ for up-conversion of the respective selected down-converted signal, a superposition circuit connected to said second mixing stages for producing, at a signal output, an output signal containing two frequency components having a central frequency value equal to $f_2$ situated substantially centrally between them, and a control signal arrangement comprising a pair of third mixing stages each having first and second mixing inputs and a mixing output, the two second mixing inputs being connected to said signal output for generating at the respective mixing output respective control signals for separately correcting undesired amplitude and phase differences in signal processing in said signal paths, characterized in that said oscillator means comprises a second oscillator which produces phase quadrature oscillator signals having a frequency $2 \times f_2$, and a divide-by-two divider between the second oscillator and the second mixing stages, said control signal arrangement includes a pair of further mixing stages having respective third and fourth mixing inputs and further mixing outputs, said third mixing inputs each receiving a respective one of said signals having a frequency $2 \times f_2$, and said fourth mixing inputs being connected to said signal output, for generating at each of the further mixing outputs a frequency-mirror signal containing two frequency components which are mirror-image components with respect to the two frequency components in said output signal, symmetrical about the frequency $f_2$, and said further mixing outputs are coupled respectively to the third mixing inputs of said third mixing stages.

2. A receiver as claimed in claim 1, characterized in that the receiver includes a bandpass filter having an output connected between the signal output and each of the second and fourth mixing inputs, this filter having a passband which is sufficiently wide to allow the two frequency components in the output signal on the signal output to pass.

3. The receiver as claimed in claim 2, characterized in that the receiver includes an amplitude limiter having an output connected between the output of said bandpass filter and each of the second and fourth mixing inputs.

4. A receiver as claimed in claim 3, characterized in that the receiver includes an up-converted signal low-pass filter connected between the output of the amplitude limiter and each of the second and fourth mixing inputs.

5. A receiver as claimed in claim 4, characterized in that the control signal arrangement comprises frequency-mirror low-pass filters connected between the further mixing outputs and the first mixing inputs of the pair of third mixing stages, said frequency-mirror low-pass filters having a passband which is sufficiently wide to allow the two frequency components in the respective frequency-mirror signals to pass.

6. A receiver as claimed in claim 3, characterized in that the control signal arrangement comprises frequency-mirror low-pass filters connected between the further mixing outputs and the first mixing inputs of the pair of third mixing stages, said frequency-mirror low-pass filters having a passband which is sufficiently wide to allow the two frequency components in the respective frequency-mirror signals to pass.

7. A receiver as claimed in claim 2, characterized in that the control signal arrangement comprises frequency-mirror low-pass filters connected between the further mixing outputs and the first mixing inputs of the pair of third mixing stages, said frequency-mirror low-pass filters having a passband which is sufficiently wide to allow the two frequency components in the respective frequency-mirror signals to pass.

8. A receiver as claimed in claim 1, characterized in that the control signal arrangement comprises frequency-mirror low-pass filters connected between the further mixing outputs and the first mixing inputs of the pair of third mixing stages, said frequency-mirror low-pass filters having a passband which is sufficiently wide to allow the two frequency components in the respective frequency-mirror signals to pass.

* * * * *